(12) United States Patent
Lee et al.

(10) Patent No.: US 7,419,872 B2
(45) Date of Patent: Sep. 2, 2008

(54) METHOD FOR PREPARING A TRENCH CAPACITOR STRUCTURE

(75) Inventors: Ching Lee, Hsinchu County (TW); Chin Wen Lee, Hsinchu County (TW); Chin Long Hung, Miaoli County (TW); Zheng Cheng Chen, Changhua County (TW)

(73) Assignee: Promos Technologies, Inc., Hsinchu (TW)

( * ) Notice: Subject to any disclaimer, the term of this patent is extended or adjusted under 35 U.S.C. 154(b) by 0 days.

(21) Appl. No.: 11/561,957

(22) Filed: Nov. 21, 2006

(65) Prior Publication Data

US 2008/0096346 A1   Apr. 24, 2008

(30) Foreign Application Priority Data

Oct. 23, 2006   (TW) .............................. 95138935 A (51) Int. Cl.
*H01L 21/8242* (2006.01)
(52) U.S. Cl. ........................ 438/249; 438/392; 438/554; 438/561; 438/564
(58) Field of Classification Search ................ 438/243, 438/246–249, 386, 389–392, 554, 561, 564
See application file for complete search history.

(56) References Cited

U.S. PATENT DOCUMENTS

| | | | | |
|---|---|---|---|---|
| 5,360,758 A | * | 11/1994 | Bronner et al. | 438/243 |
| 5,543,348 A | * | 8/1996 | Hammerl et al. | 438/392 |
| 5,618,751 A | * | 4/1997 | Golden et al. | 438/392 |
| 5,981,332 A | * | 11/1999 | Mandelman et al. | 438/243 |
| 6,225,158 B1 | * | 5/2001 | Furukawa et al. | 438/243 |

* cited by examiner

*Primary Examiner*—M. Wilczewski
*Assistant Examiner*—Toniae M. Thomas
(74) *Attorney, Agent, or Firm*—WPAT, P.C.; Anthony King (57) ABSTRACT

A method for preparing a trench capacitor structure first forms at least one trench in a substrate, and forms a capacitor structure in the bottom portion of the trench, wherein the capacitor structure includes a buried bottom electrode positioned on a lower outer surface of the trench, a first dielectric layer covering an inner surface of the bottom electrode and a top electrode positioned on the surface of the dielectric layer. Subsequently, a collar insulation layer is formed on the surface of the first dielectric layer above the top electrode, and a first conductive block is then formed in the collar insulation layer. A second conductive block with dopants is formed on the first conductive block, and a thermal treating process is performed to diffuse the dopants from the second conductive block into an upper portion of the semiconductor substrate to form a buried conductive region.

15 Claims, 8 Drawing Sheets

METHOD FOR PREPARING A TRENCH CAPACITOR STRUCTURE

BACKGROUND OF THE INVENTION (A) Field of the Invention

The present invention relates to a method for preparing a trench capacitor structure, and more particularly, to a method for preparing a trench capacitor structure capable of preventing current leakage due to the conduction of a parasitic transistor.

(B) Description of the Related Art

A memory unit of a dynamic random access memory (DRAM) includes an access transistor and a storage capacitor, wherein a source of the access transistor is connected to a top electrode of the storage capacitor, and a bottom electrode of the storage capacitor is connected to a positive voltage. In particular, as the quantity of charges stored on the capacitor becomes greater, the occurrence of read error by a read amplifier caused by noises can be greatly reduced. Therefore, memory units of current DRAM designs usually adopt a stacked capacitor of three-dimensional structure or a trench capacitor structure to increase the accumulated charges on the capacitor.

The current leakage phenomenon of the memory unit of the DRAM may decrease the charges stored on the capacitor, and the capacitor must be periodically refreshed to avoid data storage error caused by the excessive decrease of the stored charges. However, additional refresh operations may cause more power consumption of the DRAM. Therefore, the current leakage phenomenon greatly influences the electrical performance of the DRAM.

SUMMARY OF THE INVENTION

One aspect of the present invention provides a method for preparing a trench capacitor structure capable of reducing the current leakage phenomenon, wherein the thickness of a gate oxide layer of the parasitic transistor disposed in the trench is increased to raise the turn-on threshold voltage of the parasitic transistor, thereby avoiding the current leakage phenomenon caused by the conduction of the parasitic transistor.

A method for preparing a trench capacitor structure according to this aspect of the present invention first forms at least one trench in a semiconductor substrate, and forms a capacitor in the lower portion of the trench, wherein the capacitor comprises a buried bottom electrode positioned on the lower outer surface of the trench, a first dielectric layer covering the inner sidewall of the trench and a top electrode filling the lower portion of the trench. A collar insulation layer is then formed on an upper inner sidewall of the trench, and a first conductive block is formed in the collar insulation layer. Subsequently, a second conductive block with dopants is formed on the first conductive block, and a thermal treating process is performed to diffuse the dopants from the second conductive block into the semiconductor substrate on an upper outer surface of the trench to form a buried conductive region.

The trench capacitor structure contains a parasitic transistor consisting of the first conductive block (gate node), the buried bottom electrode (source node) and the buried conductive region (drain node), wherein a carrier channel is disposed in the semiconductor substrate between the buried bottom electrode and the buried conductive region. When an appropriate voltage is applied on the first conductive block (gate node), the parasitic transistor may be turned on if the gate oxide layer consisting of the first dielectric layer and the collar insulation layer is not thick enough. Consequently, a carrier channel is formed in the semiconductor substrate between the buried bottom electrode and the buried conductive region, which results in a loss of the charges stored in the capacitor, i.e., the current leakage phenomenon occurs. The present method can effectively increase the thickness of the gate oxide layer of the parasitic transistor to raise the turn-on threshold voltage of the parasitic transistor, thereby avoiding the current leakage phenomenon caused by the conduction of the parasitic transistor.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
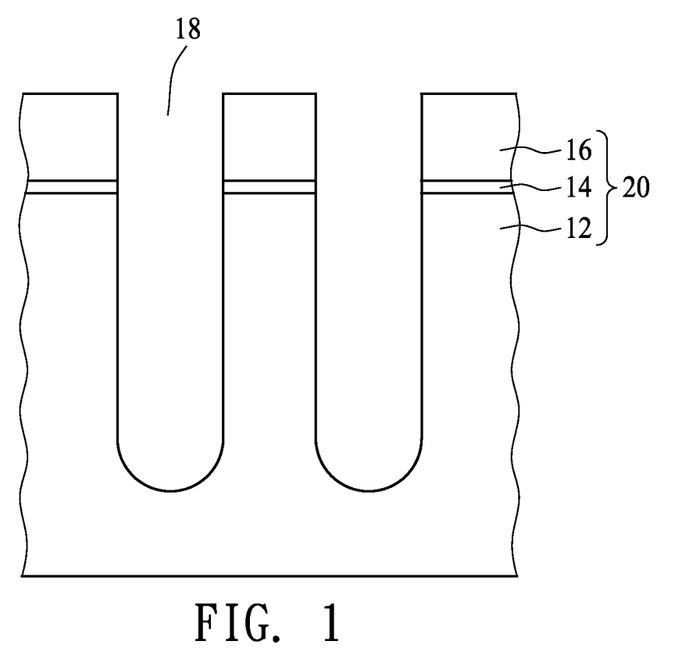
FIG. 1 to FIG. 16 illustrate a method for preparing a trench capacitor structure according to one embodiment of the present invention.
Figure 2:
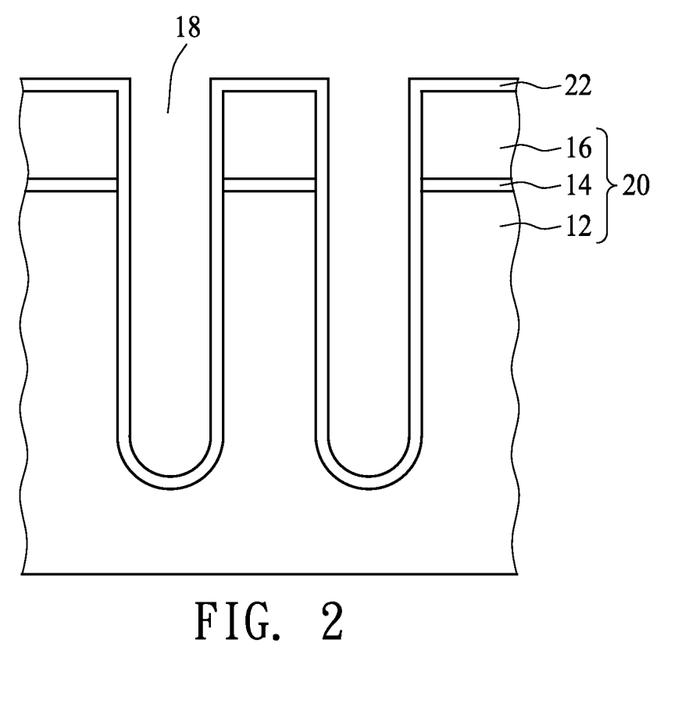

FIG. 1 to FIG. 16 illustrate a method for preparing a trench capacitor structure 10 according to one embodiment of the present invention. First, at least one trench 18 is formed in a substrate 20 including a semiconductor substrate 12 such as a silicon substrate, a silicon oxide layer 14 and a silicon nitride layer 16. A deposition process is then performed to form a dielectric layer 22 with dopants in the trench 18, wherein the dielectric layer 22 covers the inner sidewall of the trench 18 and the surface of the substrate 20, as shown in FIG. 2. The dielectric layer 22 can be formed of arsenic silicon glass (ASG), and the dopants are arsenic ions.

Figure 3:
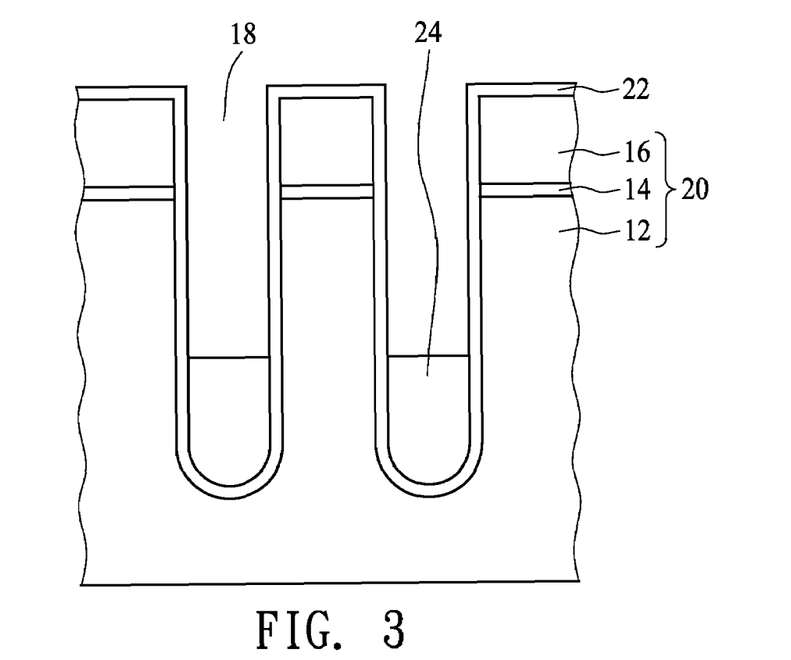
Figure 4:
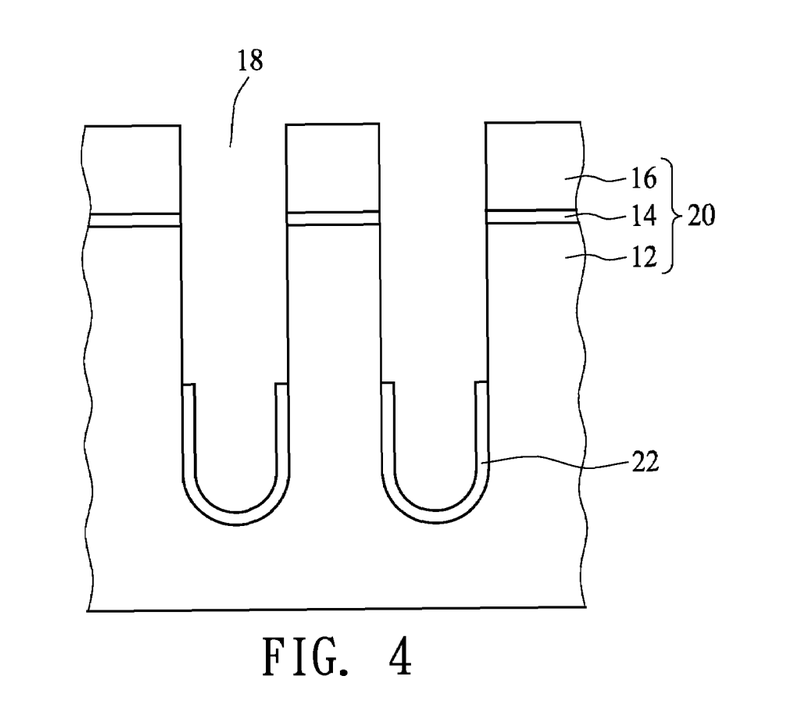

Referring to FIG. 3, a spin-coating process is performed to form a photoresist layer 24 filling the trench 18, and an anisotropic dry etching process is then performed to remove a portion of the photoresist layer 24. Subsequently, a wet etching process, using the photoresist layer 24 as an etching mask and a buffered hydrofluoric acid as an etching solution, is performed to remove a portion of the dielectric layer 22 above the photoresist 24 such that the dielectric layer 22 only covers the lower inner sidewall of the trench 18, and the photoresist layer 24 in the trench 18 is then removed completely, as shown in FIG. 4.

Figure 5:
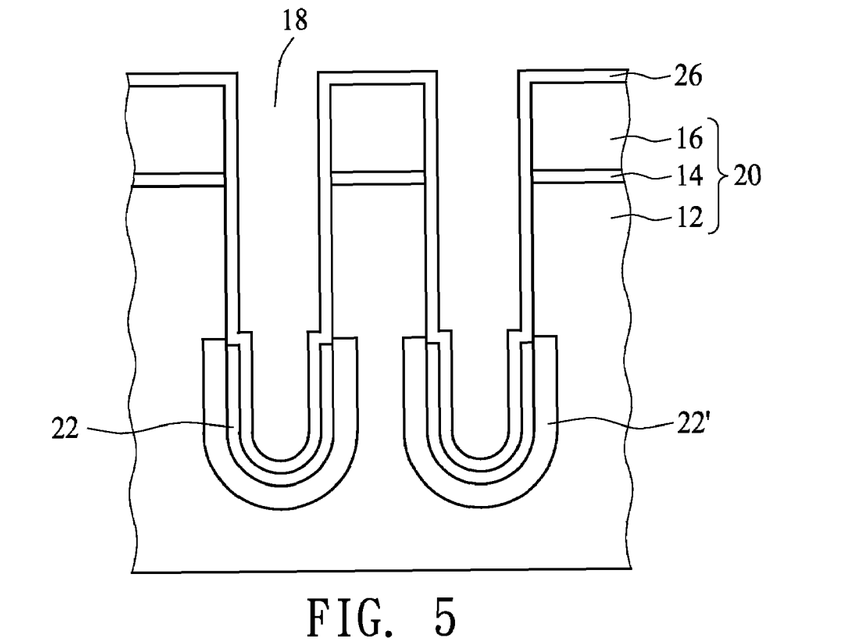
Figure 6:
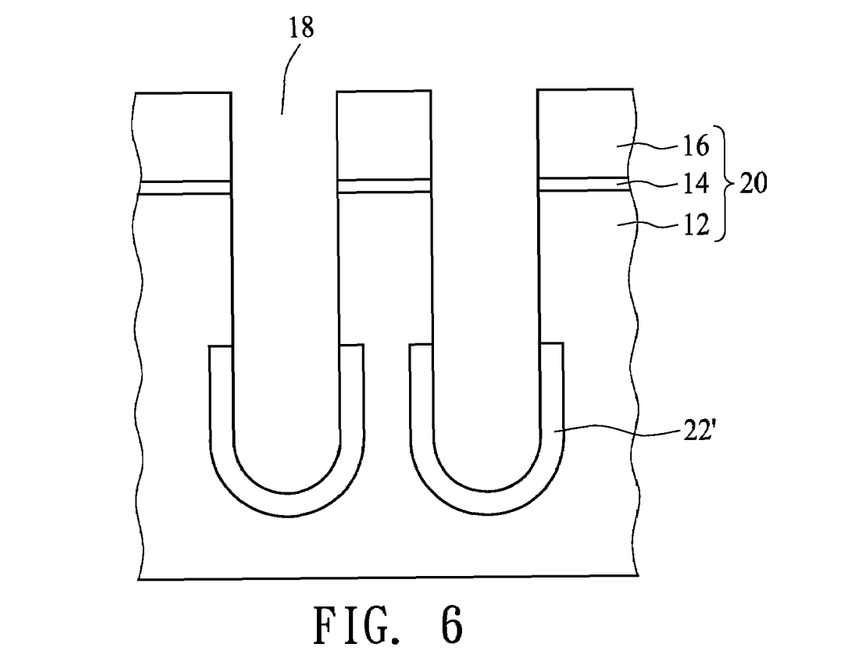

Referring to FIG. 5, a deposition process is performed to form a dielectric layer 26 covering the dielectric layer 22 and the inner sidewall of the trench 18, wherein the dielectric layer 26 can be formed of tetra-ethyl-ortho-silicate (TEOS). Afterwards, a thermal treating process is performed to diffuse the dopants of the dielectric layer 22 into the semiconductor substrate 12 on the lower outer surface of the trench 18 so as to form a buried bottom electrode 22' on the lower outer surface of the trench 18. A wet etching process using the buffered hydrofluoric acid as the etching solution is performed to remove the dielectric layer 22 and the dielectric layer 26, as shown in FIG. 6.

Figure 7:
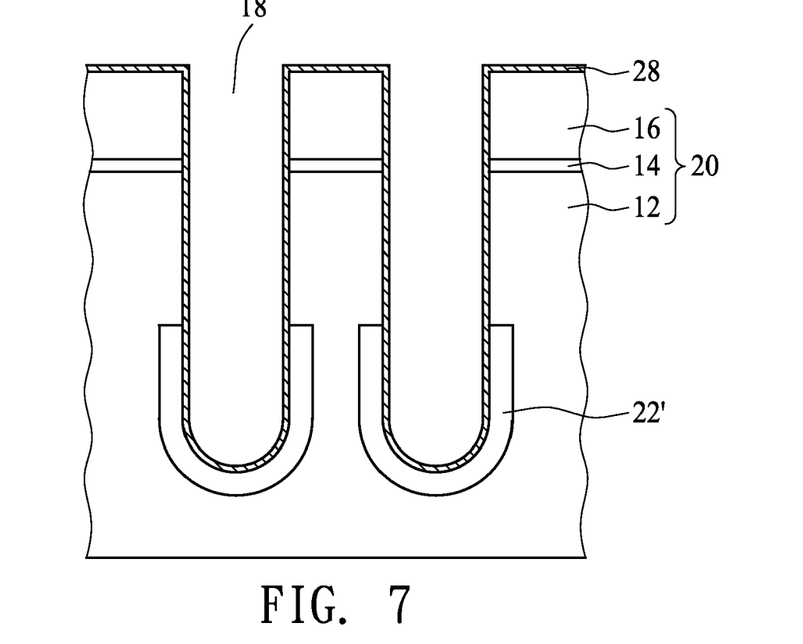
Figure 8:
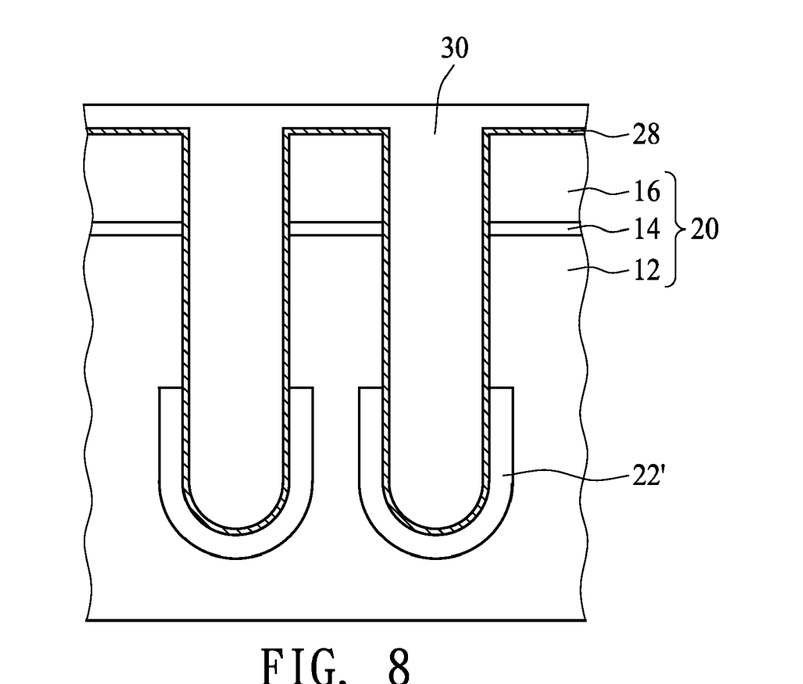

Referring to FIG. 7, a deposition process is performed to form a dielectric layer 28 covering the inner sidewall of the trench 18, wherein the dielectric layer 28 can be a laminated dielectric structure of silicon oxide-silicon nitride or a laminated dielectric structure of silicon oxide-silicon nitride-silicon oxide (ONO). After that, a deposition process is performed to form a conductive layer 30 filling the trench 18, wherein the conductive layer 30 can be formed of doped polysilicon, as shown in FIG. 8.

Figure 9:
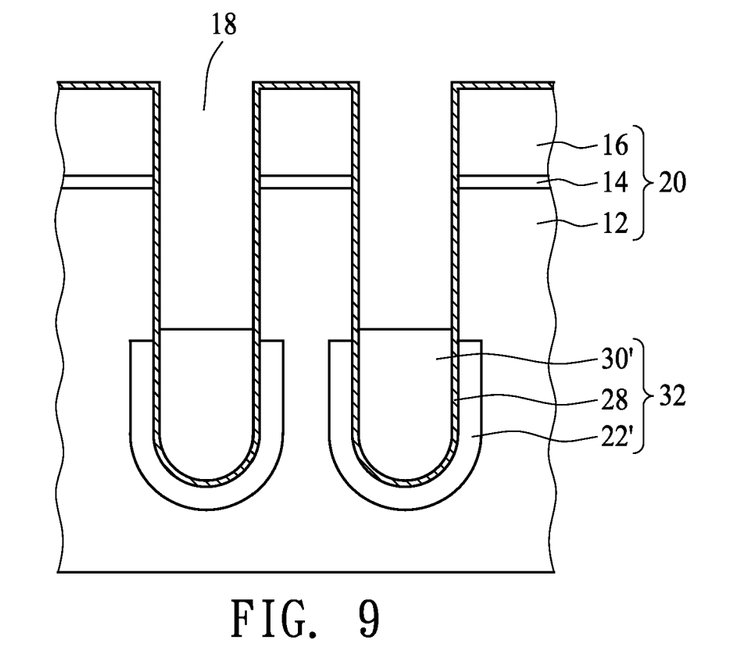

Referring to FIG. 9, a planarization process such as chemical mechanical polishing process is performed to remove a portion of the conductive layer 30 above the substrate 20, and an anisotropic dry etching process is then performed to remove a portion of the conductive layer 30 from the trench 18 so as to form a top electrode 30' filling the lower portion of the trench 18. In particular, the buried bottom electrode 22', the dielectric layer 28 and the top electrode form a capacitor 32 in the lower portion of the trench 18, wherein the dielectric layer 28 covers the inner sidewall of the trench 18.

Figure 10:
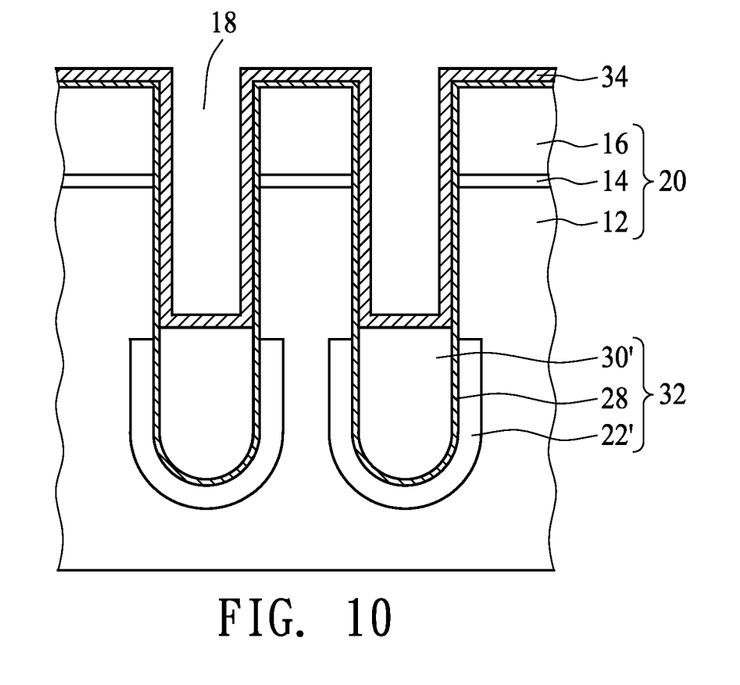
Figure 11:
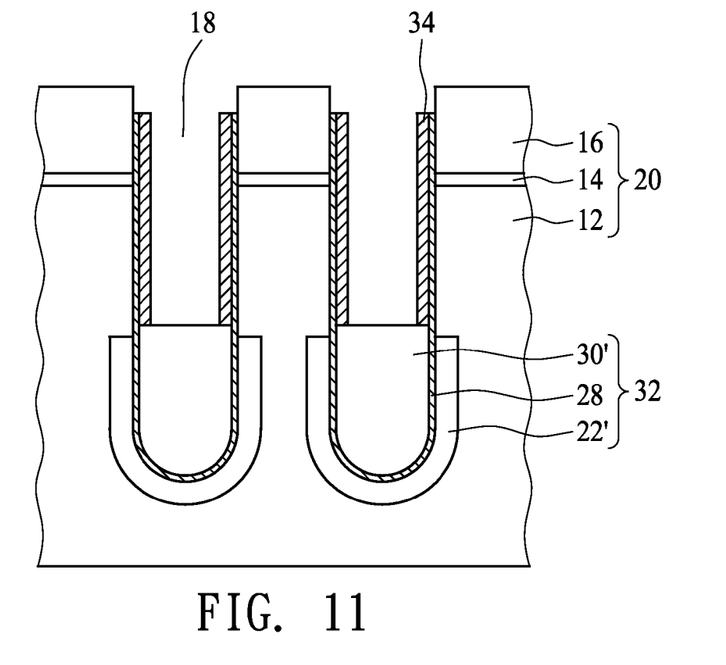

Referring to FIG. 10, a deposition process is performed to form a collar insulation layer 34 on the upper inner sidewall of the trench 18, i.e., covering the dielectric layer 28 above the top electrode 30', wherein the collar insulation layer 34 can be formed of silicon oxide. An anisotropic dry etching process is then performed to remove a portion of the collar insulation layer 34 and the dielectric layer 28 on the surface of the substrate 20 so as to reduce the height of the collar insulation layer 34 and the dielectric layer 28 to be lower than the surface of the substrate 20, as shown in FIG. 11.

Figure 12:
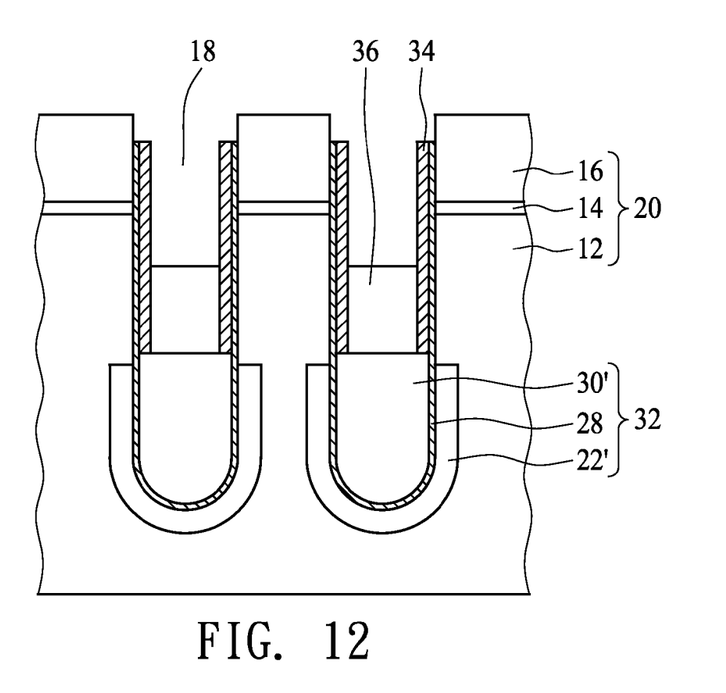
Figure 13:
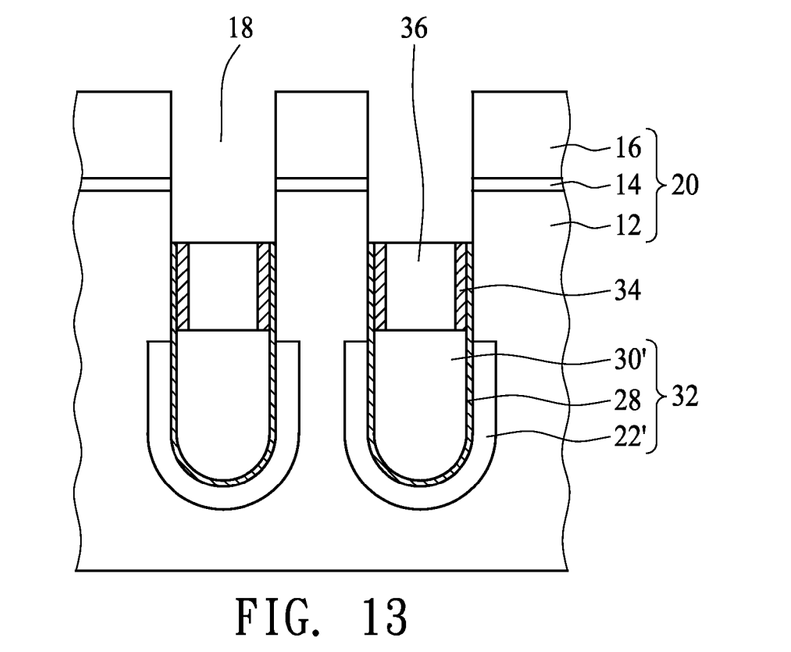

Referring to FIG. 12, a deposition process is performed to form a conductive layer filling the trench 18, and a planarization process is then performed to remove a portion of the conductive layer on the surface of the substrate 20. Afterwards, an anisotropic dry etching process is performed to remove a portion of the conductive layer to form a conductive block 36 in the collar insulation layer 34. Thereafter, a wet etching process, using the conductive block 36 as an etching mask and the buffered hydrofluoric acid as an etching solution, is performed to remove a portion of the dielectric layer 28 and collar insulation layer 34 above the conductive block 36, as shown in FIG. 13.

Figure 14:
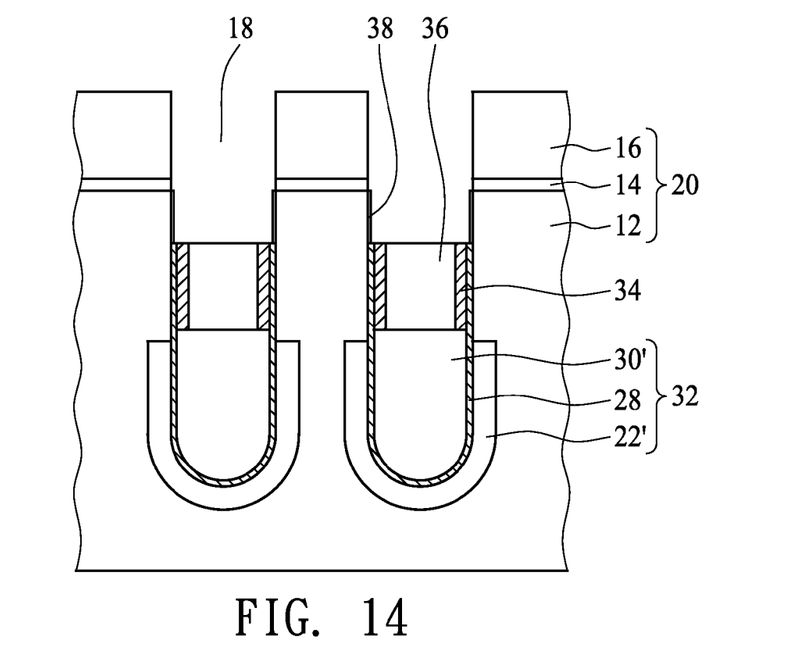
Figure 15:
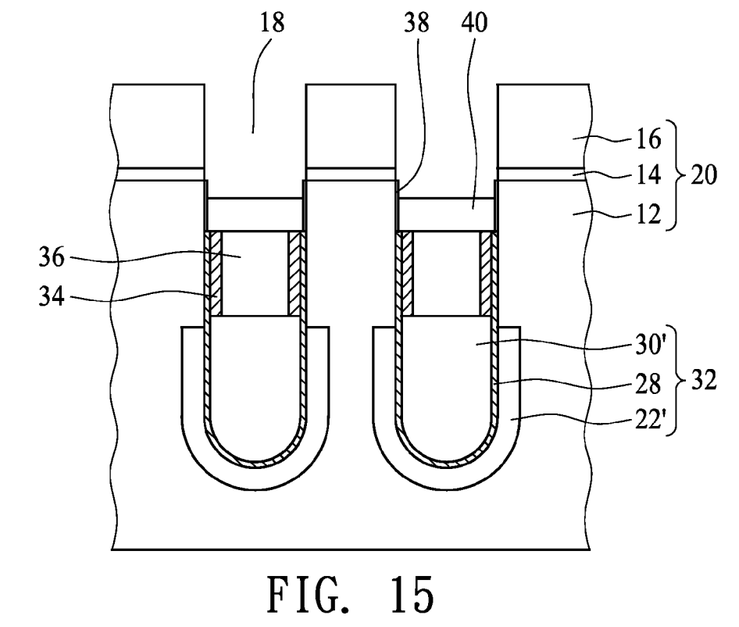

Referring to FIG. 14, a nitridation process is performed in a nitrogen-containing atmosphere. As the wet etching process exposes a portion of the semiconductor substrate 12 in the trench 18, nitrogen gas can react with the exposed semiconductor substrate 12 (i.e., the inner sidewall of the trench 18 above the conductive block 36) to form a buried stripe 38 formed of silicon nitride. Next, a deposition process is performed to form a conductive layer such as a polysilicon layer filling the trench 18, wherein the conductive layer contains dopants such as arsenic ions. Afterwards, a planarization process is performed to remove a portion of the conductive layer on the surface of the substrate 20, and an anisotropic dry etching process is then performed to remove a portion of the conductive layer to form a conductive block 40, as shown in FIG. 15.

Figure 16:
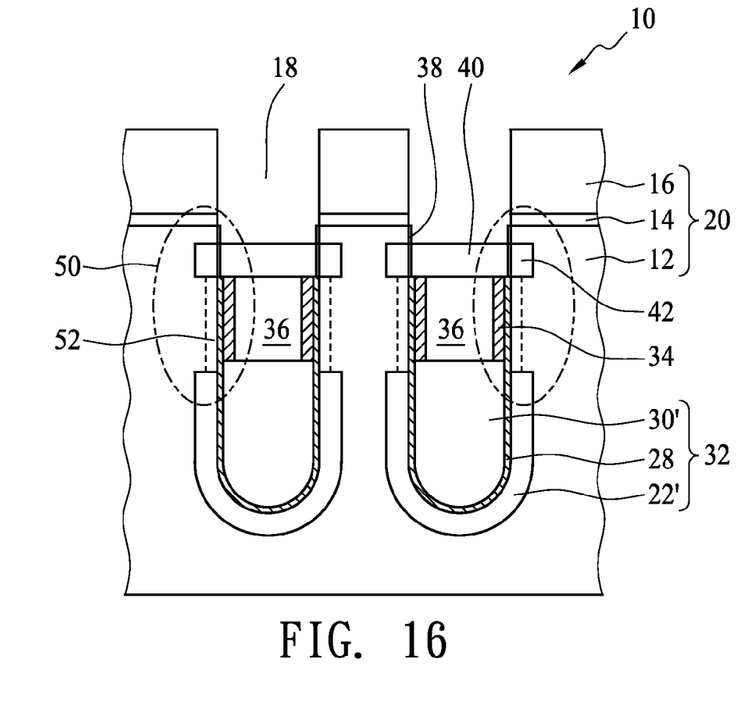

Referring to FIG. 16, a thermal treating process is performed to diffuse dopants (arsenic ions) from the conductive block 40 into the semiconductor substrate 12 on an upper outer surface of the trench 18 to form a buried conductive region 42 in the semiconductor substrate 12 to complete the trench capacitor structure 10. The trench capacitor structure 10 contains a parasitic transistor 50 consisting of the conductive block 36 (gate node), the buried bottom electrode 22' (source node) and the buried conductive region 42 (drain node), wherein the carrier channel 52 is disposed in the semiconductor substrate 12 between the buried bottom electrode 22' and the buried conductive region 42.

When an appropriate voltage is applied to the conductive block 36 (gate node), the parasitic transistor 50 may be turned on to form a carrier channel 52 in the semiconductor substrate 12 if a gate oxide layer consisting of the dielectric layer 28 and the collar insulation layer 34 is not thick enough, which results in a loss of the charges stored in the capacitor 32, i.e., the current leakage phenomenon occurs. The present method can effectively increase the thickness of the gate oxide layer of the parasitic transistor 50 so as to raise the turn-on threshold voltage of the parasitic transistor 50, thereby avoiding the current leakage phenomenon caused by the conduction of the parasitic transistor 50.

The above-described embodiments of the present invention are intended to be illustrative only. Numerous alternative embodiments may be devised by those skilled in the art without departing from the scope of the following claims.

What is claimed is:

1. A method for preparing a trench capacitor structure, comprising the steps of:
    forming at least one trench in a substrate;
    forming a capacitor in a lower portion of the trench, wherein the capacitor comprises a first dielectric layer covering an inner sidewall of the trench and a top electrode filling the lower portion of the trench;
    forming a collar insulation layer on an upper inner sidewall of the trench;
    forming a first conductive block in the collar insulation layer;
    forming a second conductive block with dopants on the first conductive block;
    performing a first thermal treating process to diffuse the dopants from the second conductive block into the substrate on an upper outer surface of the trench;
    wherein the collar insulation layer covers the first dielectric layer above the top electrode; and
    performing a wet etching process to remove the collar insulation layer and the first dielectric layer above the first conductive block.

2. The method for preparing a trench capacitor structure of claim 1, wherein the step of forming a capacitor in the lower portion of the trench comprises forming a buried bottom electrode on the lower outer surface of the trench.

3. The method for preparing a trench capacitor structure of claim 2, wherein the step of forming a buried bottom electrode on the lower outer surface of the trench comprises:
    forming a second dielectric layer with dopants on a lower inner sidewall of the trench;
    forming a third dielectric layer covering the second dielectric layer and the inner sidewall of the trench; and
    performing a second thermal treating process to diffuse the dopants from the second dielectric layer into the substrate on the lower outer surface of the trench.

4. The method for preparing a trench capacitor structure of claim 3, wherein the second dielectric layer is formed of arsenic silicon glass and the third dielectric layer is formed of tetra-ethyl-ortho-silicate.

5. The method for preparing a trench capacitor structure of claim 3, wherein the step of forming a second dielectric layer with dopants on the lower inner sidewall of the trench comprises:
    performing a deposition process to form the second dielectric layer with dopants on the inner sidewall of the trench and on the surface of the substrate;
    forming a mask filling the lower portion of the trench; and
    performing a wet etching process to remove a portion of the second dielectric layer above the mask.

6. The method for preparing a trench capacitor structure of claim 1, wherein the step of forming a top electrode in the lower portion of the trench comprises:
    performing a deposition process to form a conductive layer filling the trench; and
    performing an anisotropic etching process to remove a portion of the conductive layer.

7. The method for preparing a trench capacitor structure of claim 6, further comprising performing a planarization process to remove a portion of the conductive layer above the first dielectric layer.

8. The method for preparing a trench capacitor structure of claim 1, wherein the collar insulation layer is formed on the surface of the first dielectric layer above the capacitor by using a deposition process.

9. The method for preparing a trench capacitor structure of claim 8, further comprising performing an anisotropic etching process to remove a portion of the collar insulation layer on the surface of the substrate.

10. The method for preparing a trench capacitor structure of claim 1, wherein the step of forming a first conductive block in the collar insulation layer comprises:
   performing a deposition process to form a conductive layer filling the trench; and
   performing an anisotropic etching process to remove a portion of the conductive layer to form the first conductive block.

11. The method for preparing a trench capacitor structure of claim 10, further comprising performing a planarization process to remove a portion of the conductive layer on the surface of the substrate.

12. The method for preparing a trench capacitor structure of claim 1, wherein the wet etching process is performed to expose the inner sidewall of the trench above the first conductive block.

13. The method for preparing a trench capacitor structure of claim 12, further comprising performing a nitridation process to form a buried stripe on the inner sidewall of the trench above the first conductive block.

14. The method for preparing a trench capacitor structure of claim 1, wherein the step of forming a second conductive block with dopants on the first conductive block comprises:
   performing a deposition process to form a conductive layer filling the trench, wherein the conductive layer contains dopants; and
   performing an anisotropic etching process to remove a portion of the conductive layer to form the second conductive block.

15. The method for preparing a trench capacitor structure of claim 14, further comprising performing a planarization process to remove a portion of the conductive layer on the surface of the substrate.

* * * * *